(12) United States Patent
Reynard et al.

(10) Patent No.: US 12,048,257 B2
(45) Date of Patent: Jul. 23, 2024

(54) INTERCONNECTION STRUCTURE OF AN INTEGRATED CIRCUIT

(71) Applicants: COMMISSARIAT A L'ENERGIE ATOMIQUE ET AUX ENERGIES ALTERNATIVES, Paris (FR); STMicroelectronics (Crolles 2) SAS, Crolles (FR)

(72) Inventors: Jean-Philippe Reynard, Grenoble (FR); Sylvie Del Medico, Crolles (FR); Philippe Brun, Grenoble (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 18/296,331

(22) Filed: Apr. 5, 2023

(65) Prior Publication Data

US 2023/0247919 A1 Aug. 3, 2023

Related U.S. Application Data

(62) Division of application No. 17/112,842, filed on Dec. 4, 2020, now Pat. No. 11,653,577.

(30) Foreign Application Priority Data

Dec. 6, 2019 (FR) ........................................ 1913902

(51) Int. Cl.
*H10N 70/00* (2023.01)
*H10B 61/00* (2023.01)
*H10B 63/00* (2023.01)
*H10N 50/01* (2023.01)
*H10N 50/80* (2023.01)
*H10N 70/20* (2023.01)

(52) U.S. Cl.
CPC .......... *H10N 70/011* (2023.02); *H10B 61/00* (2023.02); *H10B 63/00* (2023.02); *H10N 50/01* (2023.02); *H10N 50/80* (2023.02); *H10N 70/231* (2023.02); *H10N 70/826* (2023.02)

(58) Field of Classification Search
None
See application file for complete search history.

(56) References Cited

U.S. PATENT DOCUMENTS

| 6,368,979 | B1 | 4/2002 | Wang et al. |
| 6,783,995 | B2 | 8/2004 | Hineman et al. |
| 6,806,096 | B1 | 10/2004 | Kim et al. |

(Continued)

FOREIGN PATENT DOCUMENTS

EP 3483889 A1 5/2019

*Primary Examiner* — Mounir S Amer
(74) *Attorney, Agent, or Firm* — Seed IP Law Group LLP

(57) ABSTRACT

A method for manufacturing an interconnection structure for an integrated circuit is provided. The integrated circuit includes a first insulating layer, a second insulating layer, and a third insulating layer. Electrical contacts pass through the first insulating layer, and a component having an electrical contact region is located in the second insulating layer. The method includes etching a first opening in the third layer, vertically aligned with the contact region. A fourth insulating layer is deposited to fill in the opening, and a second opening is etched to the contact region by passing through the opening in the third insulating layer. A metal level is formed by filling in the second opening with a metal.

16 Claims, 4 Drawing Sheets

(56) References Cited

U.S. PATENT DOCUMENTS

| | | |
|---|---|---|
| 7,183,130 B2 | 2/2007 | Nuetzel et al. |
| 10,008,662 B2 | 6/2018 | You et al. |
| 10,121,964 B2 | 11/2018 | Tan et al. |
| 2012/0313256 A1 | 12/2012 | Lu et al. |
| 2016/0043137 A1* | 2/2016 | Lu ................ G11C 13/0011 257/295 |
| 2017/0194557 A1* | 7/2017 | Chuang ................ H10N 50/80 |
| 2019/0140176 A1 | 5/2019 | Arnaud et al. |
| 2019/0165258 A1 | 5/2019 | Peng et al. |
| 2019/0371996 A1 | 12/2019 | Chuang et al. |
| 2020/0066580 A1* | 2/2020 | Peng ................ H01L 21/31056 |

\* cited by examiner

INTERCONNECTION STRUCTURE OF AN INTEGRATED CIRCUIT

BACKGROUND

Technical Field

The present disclosure relates generally to integrated circuits, and more specifically to interconnection structures of integrated circuits and methods for manufacturing these interconnection structures.

Description of the Related Art

Integrated circuits are known comprising a semiconductor layer, a stack of insulating layers resting on the semiconductor layer and an interconnection structure resting on the stack of insulating layers. These circuits comprise electrical contact vias resting on and in contact with electrical contact zones formed from the semiconductor layer and passing through a part of the stack of insulating layers, and at least one electronic component comprising an electrical contact region arranged at an intermediate level of the stack of insulating layers, between the level of the tops of the electrical contact vias and the first metal level of the interconnection structure, that is to say, the metal level closest to the semiconductor layer.

BRIEF SUMMARY

In the integrated circuits disclosed above, the known electrical connections between the first metal level and the electrical contact regions arranged between the top of the contact vias and the first metal level have various drawbacks. The methods for manufacturing these known electrical connections also have various drawbacks.

There is a need to address all or some of the drawbacks of these known electrical connections and/or the methods for manufacturing them.

One embodiment addresses all or some of the drawbacks of the known electrical connections as previously disclosed.

One embodiment addresses all or some of the drawbacks of the known methods for manufacturing electrical connections between the first metal level of an interconnection structure and an electrical contact region as previously disclosed.

One embodiment provides a method for manufacturing an interconnection structure comprising the following successive steps:
a) providing an integrated circuit comprising: a first insulating layer; a second insulating layer resting on the first layer; a third insulating layer resting on the second layer; electrical contacts passing through the first layer; and a component of which an electrical contact region is located in the second layer and is covered by part of this second layer; b) etching a first opening through the third layer and vertically aligned with the contact region, the etching of the first opening being stopped before the contact region; c) depositing a fourth insulating layer so as to fill in the first opening and cover the third layer; d) etching a second opening through the fourth layer up to the contact region such that the second opening passes through the third insulating layer via the first opening; and e) forming a metal level of the interconnection structure by filling in the second opening with at least one metal.

According to one embodiment, in step a), the electrical contacts have tops located below the second insulating layer.

According to one embodiment, in step a), the integrated circuit further comprises first electrically conductive vias passing through the second insulating layer and extending from a corresponding electrical contact to said third layer.

According to one embodiment, third openings are etched at the same time as the second opening in step d), each third opening being etched vertically aligned with one of the first vias and up to said first via.

According to one embodiment, step d) comprises depositing a first layer of photoresist and aligning an exposure mask of the first photoresist layer with said first vias.

According to one embodiment, in step a), a fifth insulating layer covers the contact region, and in step d), the etching of the second opening comprises a first etching up to said fifth layer followed by a second etching through the fifth layer and up to the contact region.

According to one embodiment, the first etching is selective relative to the third insulating layer and the fifth insulating layer.

According to one embodiment, in step d), the third openings are etched up to the third layer during the first etching, then up to the first vias during the second etching.

According to one embodiment, step b) comprises depositing a second layer of photoresist and aligning an exposure mask of the second photoresist layer with said contact region.

According to one embodiment, in step d), the first opening has lateral dimensions smaller than corresponding lateral dimensions of the contact region.

According to one embodiment, step e) comprises depositing at least one metal so as to fill in the second opening and to cover the fourth insulating layer, and a chemical mechanical polishing step up to the fourth insulating layer.

According to one embodiment, in step a), the first insulating layer rests on a semiconductor layer, preferably provided with electrical contact areas in contact with corresponding electrical contacts.

According to one embodiment, in step a), the electrical contact region of the component is an upper contact region, the component further comprising a lower contact region vertically aligned with the upper contact region, the lower contact region being in contact with an top of one of said electrical contacts, preferably, the component being a memory point of a phase change memory, a memory point of a magnetic memory, or a memory point of an oxide-based resistive memory.

Another embodiment provides an integrated circuit comprising:
a first insulating layer; a second insulating layer resting on the first layer; a third insulating layer resting on the second layer; electrical contacts passing through the first layer; a component comprising an electrical contact region located in the second layer below the level of the upper face of the second layer; a fourth insulating layer resting on an upper face of the third insulating layer; and a first metal level of an interconnection structure of the circuit comprising a portion extending from an upper face of the fourth layer to a contact region and resting partially on and in contact with the second insulating layer, preferably on and in contact with a shoulder defined by the second insulating layer.

According to one embodiment, the first metal level is obtained by carrying out the disclosed method.

BRIEF DESCRIPTION OF THE SEVERAL VIEWS OF THE DRAWINGS

The foregoing features and advantages, as well as others, will be described in detail in the following description of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may dispose identical structural, dimensional and material properties.

For the sake of clarity, only the operations and elements that are useful for an understanding of the embodiments described herein have been illustrated and described in detail. In particular, the usual electronic components of integrated circuits have not been described in detail, the disclosed embodiments, embodiment variants, modes of implementation, and variants of modes of implementation being compatible with these usual electronic components as well as with the manufacturing methods of these usual components.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Figure 1:
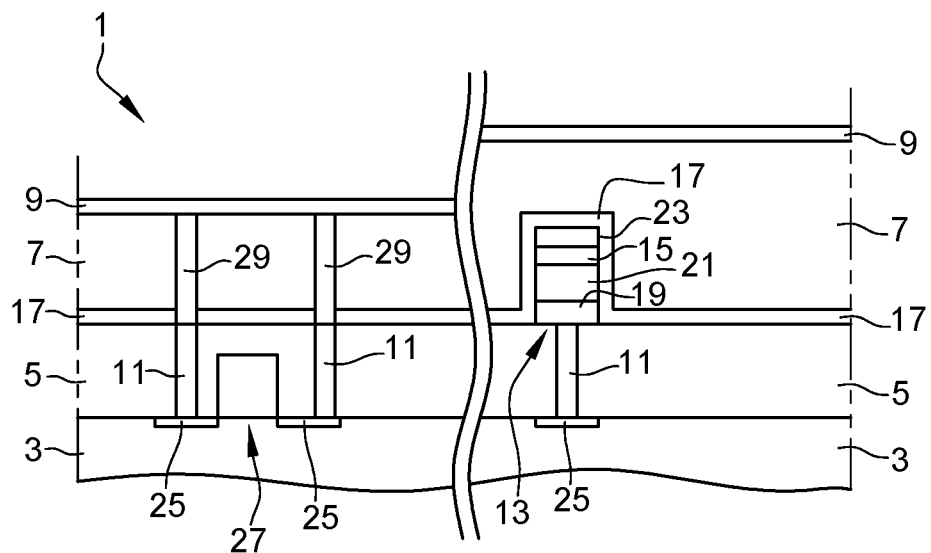
FIG. 1 shows a schematic cross-sectional view of an integrated circuit in a step of one embodiment of a method for manufacturing an interconnection structure of the integrated circuit.

FIG. 1 shows a schematic cross-sectional view of an integrated circuit 1 in a step of one embodiment of a method for manufacturing an interconnection structure of the integrated circuit 1.

The integrated circuit 1 comprises a semiconductor layer 3, for example made from silicon. The layer 3 can be a semiconductor substrate. The semiconductor layer 3 can also be a semiconductor layer resting on an insulating layer in turn resting on a support, the layer 3 then commonly being called SOI (Semiconductor On Insulator) layer.

The circuit 1 comprises an insulating layer 5 resting on the semiconductor layer 3, preferably in contact with the layer 3. Preferably, an upper face of the layer 5, that is to say, a face of the layer 5 opposite the layer 3, is planar. The layer 5 is for example made from a single insulating layer or a stack of several insulating layers, optionally made from different materials. As an example, the layer 5 comprises a layer of silicon nitride (not described in detail in FIG. 1) resting on and in contact with the layer 3, and a layer of silicon oxide (not described in detail in FIG. 1) resting on and in contact with the layer of silicon nitride.

The circuit 1 comprises an insulating layer 7 resting on the layer 5. The layer 7 is for example made from a single insulating layer or a stack of several insulating layers, optionally made from different materials. As an example, the layer 7 is a single layer of silicon oxide ($SiO_2$).

The circuit 1 comprises an insulating layer 9 resting on the layer 7, preferably in contact with the layer 7. In the step of FIG. 1, the layer 9 has an upper face, that is to say, a face opposite the layer 3, that is exposed.

According to one embodiment, the layer 9 is a diffusion barrier layer and/or an etching barrier layer.

As an example, the layer 9 is a layer of silicon carbon nitride or silicon carbonitride (SiCN), or a layer of silicon nitride (SiN), preferably a layer of SiCN.

The circuit 1 comprises electrical contact vias, or electrical contacts, 11 extending through the layer 5. Preferably, as shown in FIG. 1, the electrical contacts 11 do not penetrate the insulating layer 7. In other words, the upper level of the electrical contacts 11 is located below the level of the lower face of the layer 7. In still other words, the tops of the electrical contacts 11 are located below the layer 7. Preferably, as shown in FIG. 1, the electrical contacts 11 are flush with the upper face of the insulating layer 5. As an example, the electrical contacts 7 are made from tungsten (W).

The circuit 1 comprises an electronic component 13. The component 13 comprises an electrical contact region, or electrode, 15. The electrode 15 is located at an intermediate level of the layer 7. In other words, the electrode 15 is therefore arranged or buried in the layer 7, above the level of the lower face of the layer 7 and below the level of a portion of the upper face of the layer 7 above the electrode 15, a part of the thickness of the layer 7 then covering the electrode 15. In still other words, the electrode 15 is located below the layer 9, separated from the latter by a portion of the layer 7, and is located above the level of the tops of the electrical contacts 11. As an example, the electrode 15 is made from titanium nitride (TiN) or from tantalum nitride (TaN).

According to one embodiment, the electrode 15 is covered by an insulating layer 17, for example made from silicon nitride (SiN) or silicon carbon nitride (SiCN), preferably silicon nitride. In this example, an insulating layer 23 is inserted between the electrode 15 and the layer 17, or in other words, the layer 23 rests on and in contact with the electrode 15 and the layer 17 rests on and in contact with the layer 23. The layer 23 is for example made from SiN or SiCN, preferably from SiN. The layer 23 for example has, seen from above, the same surface as the electrode 15 that it covers. This for example results from the fact that the layer 23 corresponds to a hard mask used to define, by etching, the electrode 15 in a layer of the material of the electrode 15. In the illustrated example, the layer 17 also covers the flanks of the component 13, in particular the flanks of the layer 23, and rests, on either side of the component 13, on the layer 5, preferably in contact with the layer 5. In this example, the layer 7 rests on in contact with the layer 17. The layer 17 is preferably a diffusion barrier layer and/or an etching barrier layer. In particular, in this example where the layer 17 covers the layer 5 on either side of the component 13, this layer 17 serves as a diffusion barrier layer for the material of the electrical contacts 11.

In the illustrated example, the component 13 is a memory point of a phase change memory, for example a memory of the PCRAM ("Phase Change Random Access Memory") type. In this example, the component 13 comprises a stack successively including, from bottom to top in FIG. 1, a lower electrical contact region, or lower electrode, 19, a phase change material 21, for example an alloy of the GST type, the electrode 15 forming the upper electrode of the component 13, and the insulating layer 23. Preferably, the layers 19, 21, 15 and 23 of the stack of the component 13 are self-aligned, the layer 23 for example corresponding to the hard mask of the etching having made it possible to define the component 13. The lower electrode 19 is in contact with the top of an electrical contact 11. It will be noted that the electrode 15 can be made from a material other than TaN or TiN, in particular, in the case of a memory point 13 of a phase change memory, from a material comprising metal and the deposition of which, for example a chemical vapor deposition, is compatible with the deposition of the phase change material 21.

The circuit 1 comprises contact areas, or contact-reacting areas, in particular contact areas 25 formed from the layer 3, for example by siliconizing of portions of the layer 3, or area portions epitaxied from the layer 3. In other words, the layer 3 is provided with contact areas 25. Each contact area 25 of the layer 3 is associated with a corresponding electrical contact 11, the foot, or base, of the contact 11 then being in contact with the area 25.

According to one embodiment, as shown in FIG. 1, the circuit 1 further comprises electronic components 27 formed in and/or on the layer 3. In the example of FIG. 1, a single component 27 is shown, namely a MOS (Metal Oxide Semiconductor) transistor. The components 27 comprise contact areas, in particular contact areas 25 of the layer 3. For example, the transistor 27 of FIG. 1 comprises a drain contact area 25, and a source contact area 25. Although this is not illustrated in FIG. 1, the components 27 can comprise contact areas other than contact areas of the layer 3, for example located at an intermediate level of the layer 5, that is to say, these contact areas are above the level of the lower face of the layer 5, and below the level of the upper face of the layer 5, a portion of the thickness of the layer 5 then covering this contact area. For example, the transistor 27 comprises a gate contact area (not shown) at an intermediate level of the layer 5, an electrical contact similar to the electrical contacts 11, preferably formed at the same time as the contacts 11, then having its base in contact with the gate contact area of the transistor 27, and its top at the same level as the tops of the contacts 11.

As shown in FIG. 1, when the circuit 1 comprises a first part with components 13 (on the right in FIG. 1) and a second part with components 27 (on the left in FIG. 1), the upper face of the layer 9 can have a level difference between these two parts (separated schematically by a double curved line in FIG. 1). In particular, the upper face of the layer 9 can be at a first level in the first part and a second level lower than the first level in the second part. As an example, the level difference between the two parts of the circuit 1 is for example between 0 nm and 30 nm, for example equal or substantially equal to 15 nm.

According to one embodiment, the circuit 1 comprises electrically conductive vias 29. These vias 29 pass through the layer 7 to make contact with the electrical contact top 11. In other words, the vias 29 penetrate the layer 7 from its upper face, to the corresponding contacts 11. Preferably, the vias 29 are flush with the upper face of the layer 7, their tops then being coated with the layer 9, which can serve as a diffusion barrier layer for the material of the vias 29. As an example, the vias 29 are made from tungsten (W), cobalt (Co) or copper (Cu), preferably from tungsten.

The method disclosed hereinafter in relation with FIGS. 2 to 8 aims to form a first metal level of an interconnection structure of the circuit 1, that is to say, the metal level of the interconnection structure closest to the layer 3, or in other words, the metal level of the interconnection structure closest to the contact regions 15 and/or contact areas 25.

In the present disclosure, the expression "metal level of an interconnection structure" means a set of portions of a same metal layer arranged at a same level in the interconnection structure, the metal layer for example being made up of a single metal layer or several metal layers optionally made from different materials. Furthermore, the expression "interconnection structure" means a set of portions of metal layers embedded in insulating layers and coupled to one another by conductive vias passing through these insulating layers, the metal layer portions being organized in several metal levels.

More specifically, the method disclosed hereinafter seeks to form the first metal level of the interconnection structure of a circuit of the type of circuit 1 of FIG. 1, as well as electrical connections between this first metal level and electrodes 15, or even also electrical connections between this first metal level with vias 29, so as to electrically couple the electronic components 13, or even also 27, of the circuit to the interconnection structure.

Figure 2:
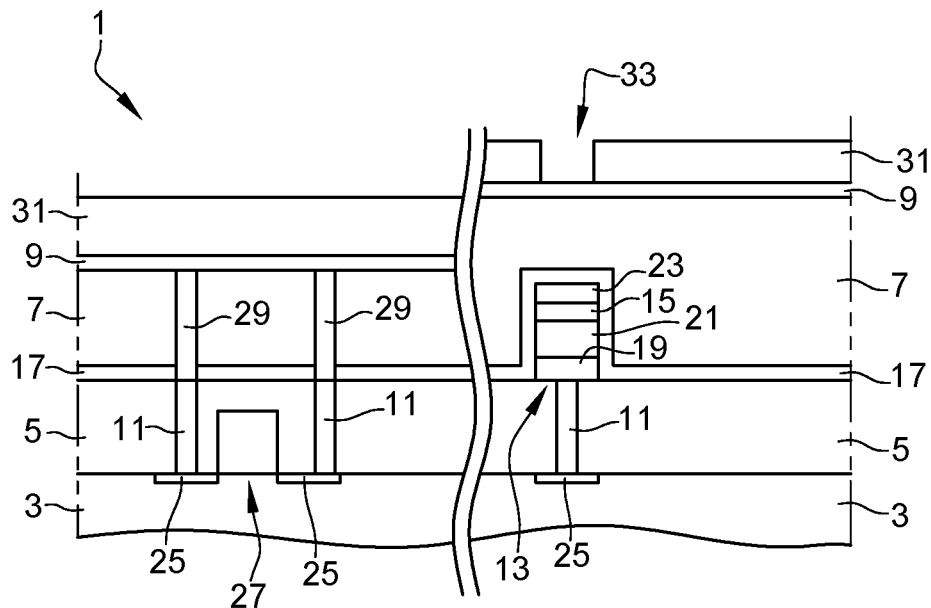
FIG. 2 shows a schematic cross-sectional view of the circuit of FIG. 1 in another step of the manufacturing method.

FIG. 2 shows the circuit 1 of FIG. 1 in a step of one embodiment of such a method.

An etching mask 31 has been formed on the layer 9, the mask 31 comprising openings 33 (a single opening 33 being visible in FIG. 2) across from each electrode 15 of a component 13. Preferably, the lateral dimensions of the opening 33, for example measured in a plane parallel to the upper surface of the layer 3, are smaller than that of the electrode 15.

Although this is not visible in FIG. 2, in top view, the electrode 15 may have an elongated shape (for example along a direction orthogonal to the plane of FIG. 2), for example a substantially rectangular shape. In this case, above the electrode 15 of the component 13, it is possible to provide one or several openings 33. For example, it is possible to provide an elongated opening 33 along the longitudinal direction of the electrode 15 when seen from above, for example to form an electrical connection between the first metal level and the electrode 15 in the form of a metal line. According to another example, it is possible to provide several openings 33, for example substantially circular openings, aligned in the longitudinal direction of the electrode 15 when seen from above, for example to form several electrical connections between the first metal level and the electrode 15 having the form of several conductive vias.

The mask 31 and the openings 33 that it comprises are obtained by depositing one or several layers of photoresist, exposing the resist with an exposure mask, and developing the exposed resist. According to one embodiment, the exposure mask is aligned with the electrode 15. It is possible to consider aligning this exposure mask with the vias 29, but this would lead to greater alignment errors between the opening 33 and the electrode 15, which is not desirable.

According to one exemplary embodiment, the mask 31 includes three layers of resists, namely a layer of carbon resist, a layer of antiglare resist, and a layer of photosensitive resist. The openings 33 are then defined through these layers of resists.

According to one embodiment variant, the mask 31 corresponds to one or several hard mask layers deposited before the resist layer(s), the openings 33 being etched in the hard mask 31 from corresponding openings previously formed in the resist layer(s) resting on the hard mask 31. As an example, the hard mask 31 comprises a layer of titanium nitride (TiN), a layer of silicon nitride (SiN) or a carbon layer.

Figure 3:
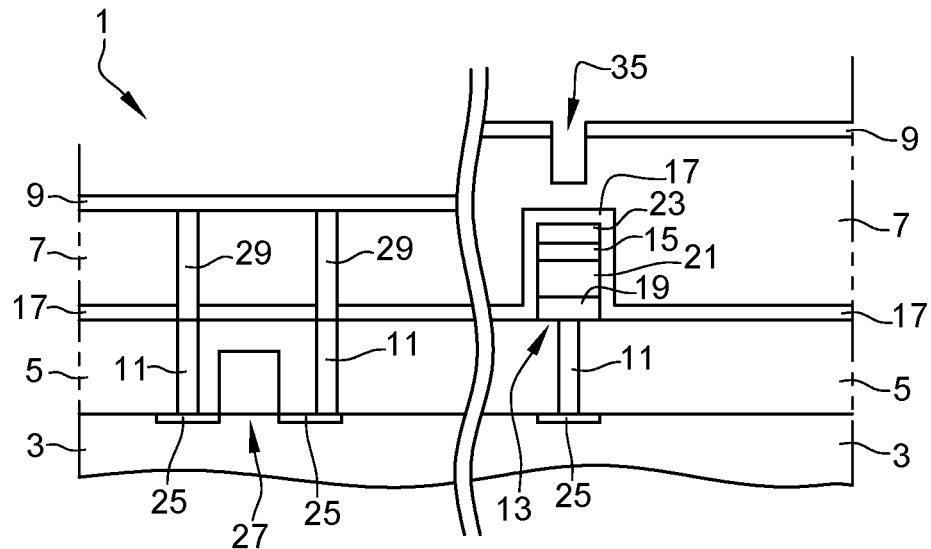
FIG. 3 shows a schematic cross-sectional view of the circuit of FIG. 2 in another step of the manufacturing method.

FIG. 3 shows the circuit 1 of FIG. 2 in a following step of the method.

An opening 35 has been etched through the layer 9, vertically aligned with the electrode 15. More specifically, the opening 35 is etched from an opening 33 of the mask 31 (FIG. 2), then the mask 31 has been removed.

The etching of the opening 35 can be stopped on the layer 7, or as shown in FIG. 3, in the layer 7. Preferably, when the layer 9 has a level difference between the first part of the circuit 1 comprising the components 13 and the second part of the circuit 1 comprising the components 27, the opening 35 penetrates the layer 7 so as to react, or compensate for, this level difference in subsequent etching steps.

Although this is not illustrated, the etching of the opening 35 can be stopped on the layer 17 covering the electrode 15 of the component 13.

As an example, the opening 35 has a depth of between 30 nm and 50 nm, for example equal to 40 nm, the depth of the opening for example being measured from the upper surface of the layer 9 to the bottom of the opening 35.

The opening 35 advantageously has lateral dimensions, for example measured in a plane parallel to the upper surface of the layer 3, smaller than those of the electrode 15. This in particular results from the fact that the layer 9 is fine or not thick, that is to say, it has a thickness for example of between 10 nm and about 20 nm, for example equal or substantially equal to 20 nm.

Figure 4:
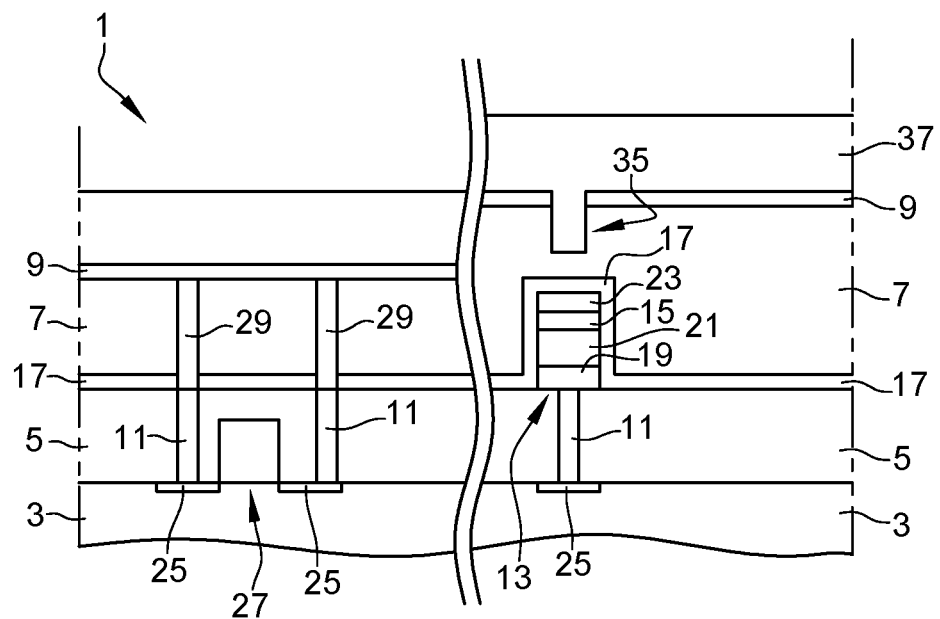
FIG. 4 shows a schematic cross-sectional view of the circuit of FIG. 3 in another step of the manufacturing method.

FIG. 4 shows the circuit 1 of FIG. 3 in a following step of the method.

An insulating layer 37 has been deposited so as to fill the opening 35 and cover the layer 9. The layer 37 corresponds to an insulating layer of the interconnection structure of the circuit 1. The layer 37 is for example made from a single insulating layer or a stack of several insulating layers, optionally made from different materials. A chemical mechanical polishing (CMP) step of the layer 37 is optionally carried out.

As an example, the layer 37 is made from silicon oxycarbide (SiOC). According to another example, the layer 37 comprises a lower layer resting on, and preferably in contact with, the layer 9, and an upper layer resting on this lower layer, the upper layer generally being made from a material with a dielectric constant lower than that of the material of the lower layer, for example a material with a dielectric constant of less than 2.6, for example equal to 2.5.

As an example, for a given integrated circuit technology, the layer 37 has a thickness of between 150 nm and 200 nm, for example equal or substantially equal to 175 nm.

Figure 5:
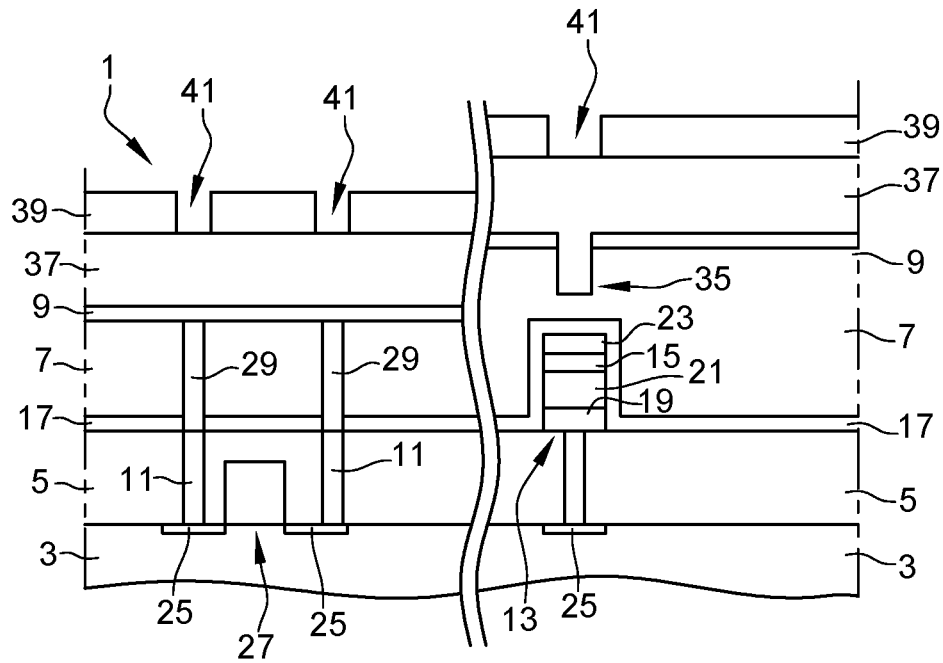
FIG. 5 shows a schematic cross-sectional view of the circuit of FIG. 4 in another step of the manufacturing method.

FIG. 5 shows the circuit 1 of FIG. 4 in a following step of the method.

An etching mask 39 has been formed on the layer 37, the mask 39 comprising an opening 41 across from the opening 35 filled with the layer 37, or in other words, across from the electrode 15. Furthermore, in the case where the circuit 1 comprises vias 29, the mask 39 also comprises openings 41 across from the vias 29.

Although this is not visible in FIG. 5, in top view, a same opening 41 can comprise several parts each across from a different opening 35.

The mask 39 and the openings 41 that it comprises are obtained by depositing a layer of photoresist, exposing the resist with an exposure mask, and developing the exposed resist. According to one embodiment, the exposure mask is aligned with the vias 29.

Although this is not described in detail here, the mask 39 can correspond to a layer of resist with openings 41, or to at least one layer deposited before the resist and through which the openings 41 are etched from corresponding openings formed in the resist, such a layer generally being called hard mask layer.

According to one embodiment, the mask 39 comprises a hard mask layer, for example a layer of titanium nitride (TiN).

Figure 6:
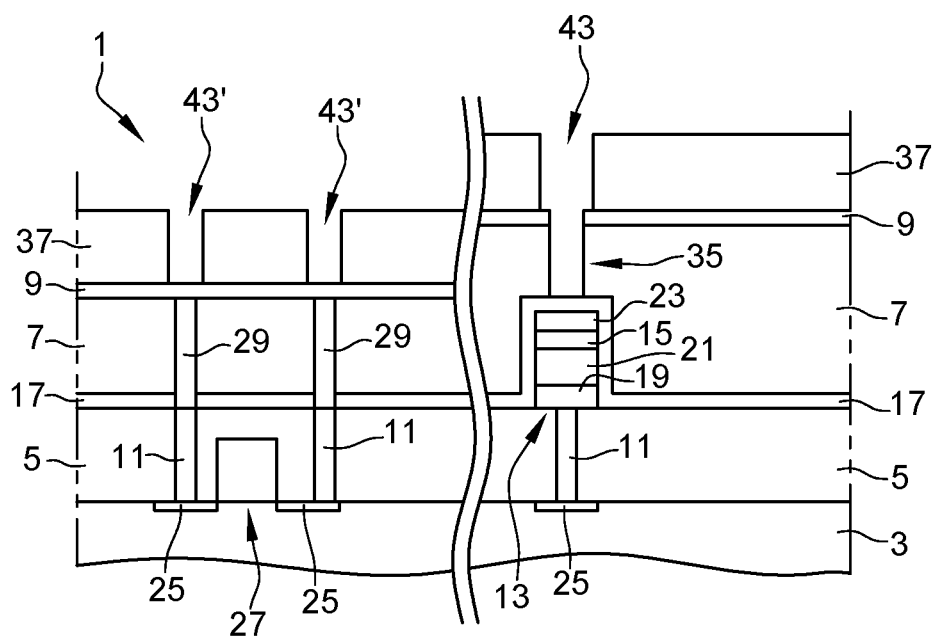
FIG. 6 shows a schematic cross-sectional view of the circuit of FIG. 5 in another step of the manufacturing method.

FIG. 6 shows the circuit 1 of FIG. 5 in a following step of the method.

An opening 43 has been etched through the layer 37 from the opening 41 of the mask 39 (FIG. 5) across from the electrode 15, and openings 43' have been etched simultaneously from openings 41 of the mask 39 (FIG. 5) across from the vias 29. The mask 39 has next been removed.

The etching is selective relative to the layer 9 and the layer 17, or in other words, is selective relative to the material of the layer 9 and the material of the layer 17. As an example, for layers 9 and 17 made from SiCN or SiN, for example a layer 9 made from SiCN and a layer 17 made from SiN, the etching, for example a dry etching, can be a fluorocarbon-based etching, for example with a base of $C_4F_8$.

The etching of the opening 43 is stopped on the layer 17 covering the electrode 15, the opening 43 then going through the opening 35 etched in the step of FIG. 4, without modifying the dimensions of the opening 35 due to the fact that the etching is selective relative to the layer 9. The opening 43 is therefore etched through the layer 37, and when the etching disclosed in the step of FIG. 5 is stopped before the layer 17, through part of the layer 7.

Furthermore, in the case where the circuit 1 comprises vias 29, the etching of each opening 43' is stopped on the layer 9.

Figure 7:
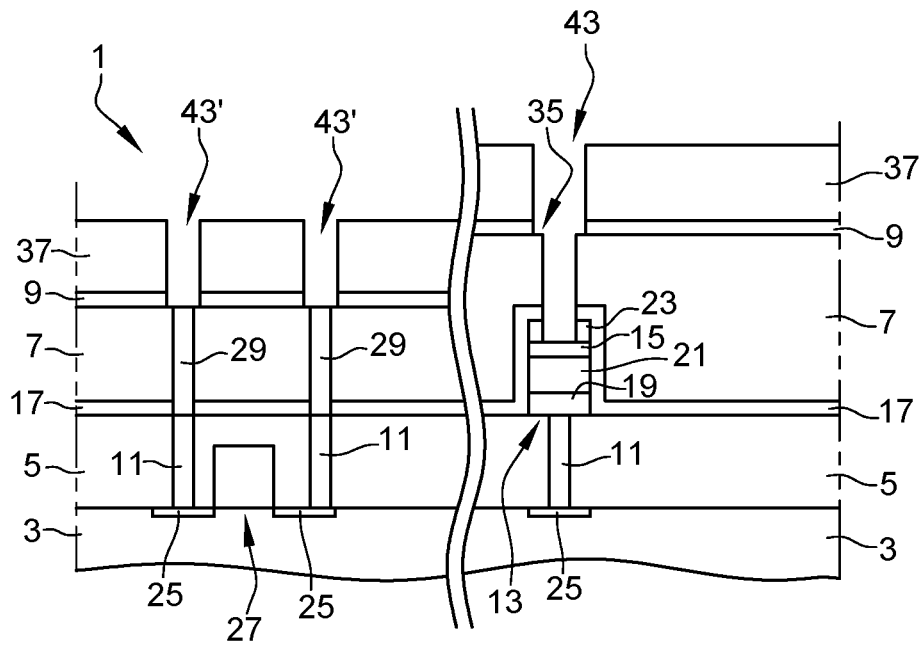
FIG. 7 shows a schematic cross-sectional view of the circuit of FIG. 6 in another step of the manufacturing method.

FIG. 7 shows the circuit 1 of FIG. 6 in a following step of the method.

In the step of FIG. 7, the etching of the opening 43 is continued until the electrode 15. Furthermore, at the same time, the etching of the openings 43' is continued until each opening 43' reaches the top of a corresponding via 29. In other words, the etching of the opening 43 is continued through the layer 17 to the electrode 15, in this example by passing through the layer 23, and, when the circuit 1 comprises vias 29, the etching of the openings 43' is continued simultaneously through the layer 9 up to the tops of the vias 29. During the etching of FIG. 7, portions of the layer 9 exposed during the etching of the opening 43 disclosed in relation with FIG. 6 are also etched. As a result, as shown in FIG. 7, the opening 43 has a shoulder defined by the layer 7, for example at the upper face of the layer 7. In other words, the layer 7 forms a shoulder in the opening 43. The dimensions of this shoulder are determined at least in part by the lateral dimensions of the opening 35 etched in the step of FIG. 3. Furthermore, the dimensions of this shoulder at least partially determine the lateral dimensions of the bottom of the opening 43 at the electrode 15.

The steps of FIGS. 6 and 7 in practice correspond to a step for etching an opening 43 extending from the upper face of the layer 37 to the electrode 15, and, in the case where the circuit comprises vias 29, etching openings 43' extending from the upper face of the layer 37 to the tops of these vias 29, this etching step being implemented by two successive etching operations.

Figure 8:
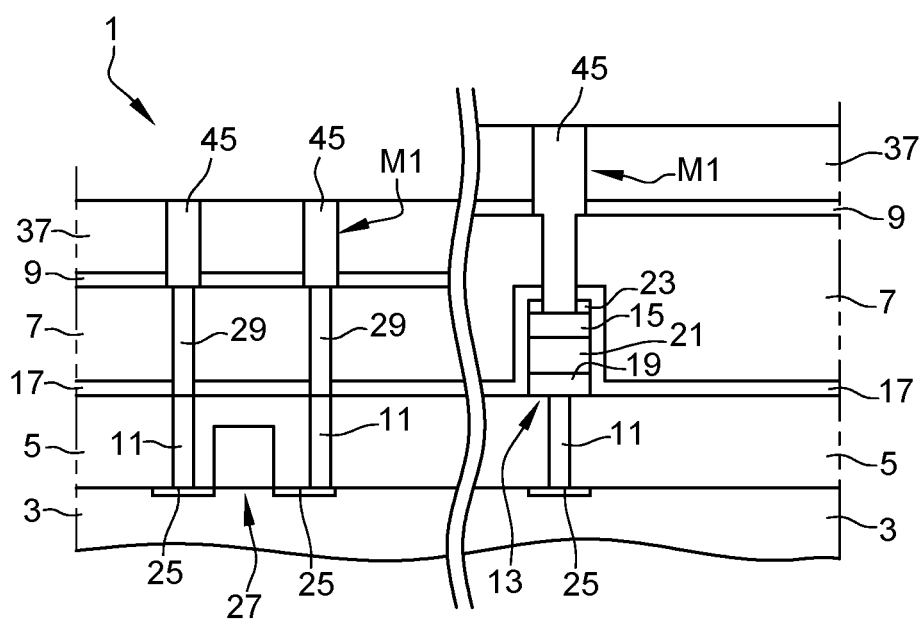
FIG. 8 shows a schematic cross-sectional view of the circuit of FIG. 7 in another step of the manufacturing method.

FIG. 8 shows the circuit 1 of FIG. 7 in a following step of the method.

In this step, the first metal level M1 of the interconnection structure of the circuit 1 is formed by depositing at least one metal layer 45 so as to fill the openings 43 and cover the layer 37, then by performing a planarizing step by chemical mechanical polishing (CMP) up to the layer 37 so as to remove the part of the layer 45 arranged above the level of the upper face of the layer 37.

As an example, a single layer 45 of copper is deposited in the step of FIG. 8.

The first metal level M1 of the interconnection structure of the circuit 1 thus obtained comprises a portion (on the right in FIG. 8) arranged vertically above the electrode 15. This portion of the metal level M1, which fills the opening 43, extends from the upper face of the layer 37 to the electrode 15 with which it is in contact, and rests partly on and in contact with the layer 7, for example on and in contact with the upper face of the layer 7. In other words, the portion of the metal level M1 arranged vertically above the electrode 15 and filling the opening 43 rests partially on the shoulder formed by the layer 7 in the opening 43. In still other words, the metal level M1 extends in the layer 37 and comprises, above the electrode 15, a portion provided with an extension that extends through an opening 35 in the layer 9, then through the layer 7 to the electrode 15. This extension has, at the shoulder formed by the layer 7 in the opening 43, for example at the upper face of the layer 7, lateral dimensions, for example measured in a plane parallel to the upper face of the layer 3, that are smaller below the shoulder than above the shoulder. In still other words, the metal level M1 comprises a portion in contact with the electrode 15, this portion comprising a lower part in contact with the electrode 15 and an upper part passing through the layer 37 over its entire thickness, the lower part having, at the level where it is in contact with the upper part, lateral dimensions smaller than that of the upper part, and the upper part resting partially on the shoulder defined by the layer 7. In this example, lateral portions of the upper part rest on the layer 7.

The obtained metal level M1 is in contact with the electrode 15 of the component 13.

Furthermore, in the case where the circuit 1 comprises vias 29, the metal level M1 is in contact with the tops of these vias 29.

The method continues with steps (not illustrated) for forming other metal levels of the interconnection structure, for example during deposition, etching, CMP steps of insulating layers and metal layers in order to form these other metal levels and conductive vias electrically coupling the metal levels of the interconnection structures to one another. These subsequent steps are within the capabilities of one skilled in the art.

Although FIGS. 1 to 8 show a single component 13, in practice, the circuit 1 can comprise several components 13, for example several thousands of components 13 in the case where the latter are memory points. In this case, the steps disclosed in relation with FIGS. 1 to 8 are carried out simultaneously for all of the components 13 of the circuit 1, the circuit 1 optionally being able to comprise different components 13. Similarly, the circuit 1 can comprise several components 27, for example several thousands of components 27. In this case, the steps disclosed in relation with FIGS. 1 to 8 in order to manufacture the metal level M1 in contact with the vias 29 electrically coupling, by means of the contact 11, the metal level M1 to the contact areas 25 of the component 27 shown in these FIGS. 1 to 8, are implemented simultaneously for all of the vias 29 associated with these components 27.

Furthermore, although a single circuit 1 has been disclosed, in practice, several circuits 1 are manufactured simultaneously from a same layer 3, the set of these circuits 1 then forming a circuit wafer 1. The steps disclosed in relation with FIGS. 1 to 8 are then preferably implemented simultaneously for all of the circuits 1 of a same wafer, then, once the manufacturing of the circuits 1 and their interconnection structures is complete, the circuits 1 are individualized by cutting out the wafer. In this case, the layer deposition steps previously disclosed are carried out over the entire exposed surface of the wafer, these deposits being described as solid plate deposits.

In the method disclosed above, the lateral dimensions of the portion of the metal level M1 at the level of the electrode 15 are at least partially determined by the lateral dimensions of the opening 35 etched in the step of FIG. 3. It may have been considered to omit the step for etching of the opening 35, and to etch an opening directly from the upper face of the layer 37 to the electrode 15. However, the opening obtained in this manner, without previous etching of the opening 35, would have had lateral dimensions at the electrode 15 that would have been larger than those of the opening 43 obtained by the method disclosed in relation with FIGS. 1 to 8. In particular, the opening etched without prior opening 35 may have overflowed on the flanks of the component 13, which would have led to forming a metal level M1 in contact with the electrode 15, but also with layers underlying the electrode 15, thus short-circuiting these layers of the component 13. To address this, it may have been considered to increase the lateral dimensions of the electrode 15, but this would have led to an increase in the surface area of the circuit 1, which is not desirable. Thus, the method disclosed in relation with FIGS. 1 to 8 makes it possible to obtain a metal level M1 in contact with an electrode 15 having smaller dimensions than if the method were to be implemented with no step for etching the opening 35 disclosed in relation with FIG. 3.

As an example, the inventors have noted that with the method disclosed above in relation with FIGS. 1 to 8, it is possible to etch an opening 43 whose bottom has, at a corresponding electrode 15, minimum lateral dimensions smaller than 40 nm, for example equal or substantially equal to 30 nm, which allows the electrode 35 to have corresponding lateral dimensions for example smaller than 60 nm, for example equal or substantially equal to 50 nm.

Furthermore, in the method disclosed in relation with FIGS. 1 to 8, in the step for etching from the opening 43 (FIGS. 6 and 7) to the electrode 15, it is not necessary for the opening 41 of the mask 39 from which the opening 43 is etched to be perfectly aligned on the electrode 15, due to the fact that the opening 35 makes it possible to react any alignment error. This would not have been the case without prior opening 35, due to the fact that the etched opening would then have been able to expose the flanks of the component 13.

Furthermore, rather than manufacturing the metal level M1 in contact with the electrode 15 of the component 13, it would have been possible to consider, during the formation of the vias 29, simultaneously forming an additional via 29 whose base would have been in contact with the electrode 15 and whose top would have been flush with the upper face of the layer 7. However, relative to the method disclosed in relation with FIGS. 1 to 8, this would have required a greater thickness of the layer 7 between the component 13 and the layer 9, which would have led to longer vias 29 and therefore greater stray capacitances, in particular for the vias 29 making it possible to electrically couple the areas 25 of the components 27 to the metal level M1, which is not desirable.

Various embodiments and variants have been described. Those skilled in the art will understand that certain features of these embodiments can be combined and other variants will readily occur to those skilled in the art. In particular, although in relation to FIGS. 1 to 8, an example has been disclosed in which the component 13 is a memory point such as a memory point of a phase change memory, the disclosed method can be implemented with other components comprising a contact region located at a level midway between the level of the tops of the contact vias 11 and the layer 9 on which the first metal level M1 of an interconnection structure of the circuit will rest, for example a memory point of a magnetic-type memory or a resistive memory with an oxide base or a component other than a memory point. Furthermore, one skilled in the art is able to modify the various materials indicated above as an example by adapting the disclosed method, in particular to respect the selectivities of the disclosed etching operations.

Finally, the practical implementation of the embodiments and variants described herein is within the capabilities of those skilled in the art based on the functional description provided hereinabove.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An integrated circuit, comprising:
a first insulating layer;
a second insulating layer on the first insulating layer;
a third insulating layer on the second insulating layer;
electrical contacts passing through the first insulating layer;
a component having an electrical contact region located in the second insulating layer below a level of an upper face of the second insulating layer;
a fourth insulating layer on an upper face of the third insulating layer; and
a first metal level of an interconnection structure including a portion extending from an upper face of the fourth insulating layer to a contact region and disposed partially on and in contact with the second insulating layer.

2. The integrated circuit according to claim 1, wherein the portion of the first metal level is disposed on and in contact with a shoulder defined by the second insulating layer.

3. The circuit according to claim 1, wherein the metal level is formed by:
etching a first opening through the third insulating layer and vertically aligned with the electrical contact region, the etching of the first opening being stopped before reaching the electrical contact region;
depositing the fourth insulating layer in the first opening and covering the third insulating layer;
etching a second opening through the fourth insulating layer, extending through the third insulating layer via the first opening; and
filling second opening with at least one metal.

4. A device, comprising:
an interconnection structure for an integrated circuit, the integrated circuit including:
a first insulating layer;
a second insulating layer on the first insulating layer;
a third insulating layer on the second insulating layer;
electrical contacts through the first insulating layer; and
a component having an electrical contact region in the second insulating layer and covered by the second insulating layer;
a first opening through the third insulating layer and aligned with the electrical contact region;
a fourth insulating layer in the first opening and on the third insulating layer;
a second opening in the fourth insulating layer, extending through the third insulating layer via the first opening; and
a metal level in the second opening.

5. The device of claim 4 wherein the electrical contacts have upper surfaces that are below the second insulating layer.

6. The device of claim 4 wherein the integrated circuit includes first electrically conductive vias through the second insulating layer and extending from a corresponding electrical contact to the third insulating layer.

7. The device of claim 6, comprising third openings aligned with and extending up to one of the first vias.

8. The device of claim 7 wherein the integrated circuit includes a fifth insulating layer on the electrical contact region.

9. The device of claim 8 wherein the first opening has lateral dimensions smaller than corresponding lateral dimensions of the electrical contact region.

10. A device, comprising:
a substrate;
a plurality of contacts in the substrate;
a first insulating layer on the substrate;
a conductive region on the substrate and the plurality of contacts;
a second insulating layer on the first insulating layer, the second insulating layer having a first portion with a first surface spaced from the substrate by a first dimension in a first direction and a second portion with a second surface spaced from the substrate by a second dimension in the first direction, the second dimension being greater than the first dimension;

a phase change memory component on the first insulating layer, the phase change memory component being in the second portion of the second insulating layer; and a first portion of a first metal layer that is coupled to a first one of the plurality of contacts through the first portion of the second insulating layer.

11. The device of claim 10 comprising a second portion of the first metal layer that is coupled to a second one of the plurality of contacts through the first portion of the second insulating layer.

12. The device of claim 11 comprising a third insulating layer on the first and second portion of the second insulating layer.

13. The device of claim 12 comprising a fourth insulating layer on the first insulating layer, the fourth insulating layer being over the phase change memory component.

14. The device of claim 12 comprising a fourth insulating layer on the third insulating layer, the fourth insulating layer having a third surface and a fourth surface that are at different distances from the substrate.

15. The device of claim 12 comprising a fourth insulating layer on the third insulating layer, the fourth insulating layer having a third surface and a fourth surface, the third surface being spaced from the substrate by a third dimension in the first direction and the fourth surface being spaced from the substrate by a fourth dimension in the first direction, the fourth dimension being greater than the third dimension.

16. The device of claim 15 wherein the fourth surface is aligned with the second portion of the second insulating layer.

\* \* \* \* \*